US011983135B2

(12) United States Patent
Subbareddy et al.

(10) Patent No.: US 11,983,135 B2
(45) Date of Patent: May 14, 2024

(54) ELECTRICAL AND OPTICAL INTERFACES AT DIFFERENT HEIGHTS ALONG AN EDGE OF A PACKAGE TO INCREASE BANDWIDTH ALONG THE EDGE

(71) Applicant: Intel Corporation, Santa Clara, CA (US)

(72) Inventors: Dheeraj Subbareddy, Portland, OR (US); Ankireddy Nalamalpu, Portland, OR (US); Anshuman Thakur, Beaverton, OR (US); Md Altaf Hossain, Portland, OR (US); Mahesh Kumashikar, Bangalore (IN); Kemal Aygün, Tempe, AZ (US); Casey Thielen, Chandler, AZ (US); Daniel Klowden, Portland, OR (US); Sandeep B. Sane, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 720 days.

(21) Appl. No.: 17/033,593

(22) Filed: Sep. 25, 2020

(65) Prior Publication Data

US 2022/0100692 A1  Mar. 31, 2022

(51) Int. Cl.
*G06F 13/42* (2006.01)
*G06F 30/30* (2020.01)
*G06F 30/347* (2020.01)

(52) U.S. Cl.
CPC ...... *G06F 13/4221* (2013.01); *G06F 13/4282* (2013.01); *G06F 30/30* (2020.01); *G06F 30/347* (2020.01); *G06F 2213/0026* (2013.01)

(58) Field of Classification Search
CPC .... G06F 30/30; G06F 30/347; G06F 13/4221; G06F 2213/0026
See application file for complete search history.

(56) References Cited

U.S. PATENT DOCUMENTS

| | | | |
|---|---|---|---|
| 10,598,860 B2* | 3/2020 | Ramachandran | G02B 6/4471 |
| 2010/0122011 A1* | 5/2010 | Arimilli | G06F 13/385 |
| | | | 710/316 |
| 2013/0214432 A1* | 8/2013 | Wu | H01L 24/17 |
| | | | 257/782 |
| 2015/0219850 A1* | 8/2015 | Fish | H04B 10/00 |
| | | | 385/14 |
| 2017/0045697 A1* | 2/2017 | Hochberg | H01S 5/0085 |
| 2019/0103357 A1* | 4/2019 | Lim | H01L 25/0652 |
| 2019/0138680 A1* | 5/2019 | Teh | H03K 19/17796 |
| 2019/0303334 A1* | 10/2019 | White | G06F 13/4027 |

* cited by examiner

*Primary Examiner* — Henry Tsai
*Assistant Examiner* — Harry Z Wang
(74) *Attorney, Agent, or Firm* — Schwabe, Williamson & Wyatt P.C.

(57) ABSTRACT

Embodiments herein relate to systems, apparatuses, or processes for improving off-package edge bandwidth by overlapping electrical and optical serialization/deserialization (SERDES) interfaces on an edge of the package. In other implementations, off-package bandwidth for a particular edge of a package may use both an optical fanout and an electrical fanout on the same edge of the package. In embodiments, the optical fanout may use a top surface or side edge of a die and the electrical fanout may use the bottom side edge of the die. Other embodiments may be described and/or claimed.

20 Claims, 5 Drawing Sheets

ELECTRICAL AND OPTICAL INTERFACES AT DIFFERENT HEIGHTS ALONG AN EDGE OF A PACKAGE TO INCREASE BANDWIDTH ALONG THE EDGE

FIELD

Embodiments of the present disclosure generally relate to the field of package assemblies, and in particular package assemblies that include optical and electrical interfaces along an edge of a package.

BACKGROUND

Consumer and business systems require high memory and input/output (I/O) bandwidth to exploit high-density compute structures in graphical process units (GPUs), field programmable gate arrays (FPGAs), and central processing units (CPUs).

DETAILED DESCRIPTION

Figure 1:
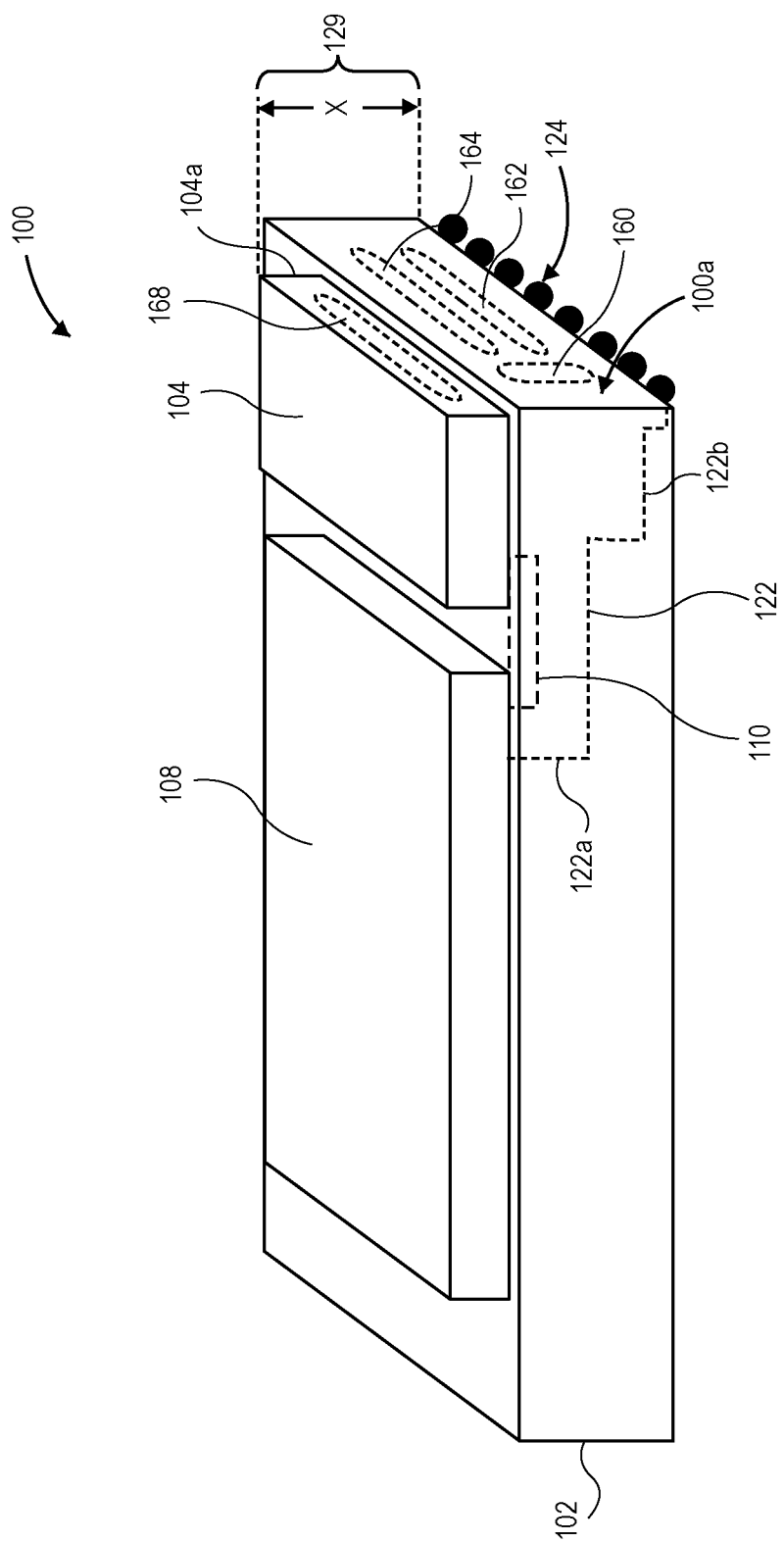
FIG. 1 illustrates a perspective view of a package assembly that includes an edge with electrical interfaces, in accordance with embodiments.

Embodiments described herein may be directed to improving off-package edge bandwidth by overlapping electrical and optical connections on one or more edges of the package. In embodiments, these connections may be include serialization/deserialization (SERDES) connection interfaces on one or more edges of the package. In embodiments, SERDES connections may be used in high-speed communications to compensated for limited input/output area on a package. For example, SERDES connections may be used to provide data transmission over a single line or differential pair, in order to minimize the number of input/output (I/O) pins and interconnects associated with the package.

As packages continue to evolve, the number of dies on a package, as well as the number of functions associated with each die, are continuing to grow. This growth is expected to continue, thus putting a growing I/O bandwidth demand on the overall package, while not growing the perimeter dimensions of the package used for I/O communication. In legacy implementations of package I/O communications, this may create an I/O throughput bottleneck of the package that may limit its functionality as a component within a computing environment.

In addition, certain types of packages may be already constrained in terms of package edges that may be used to route I/O connections, and east or west side of the package may already be fully utilized with I/O connections, for example implementing double data rate (DDR) I/O. In these packages, it may leave the north or the south side of the package, which may be narrower than the east or west side of the package, to handle any additional I/O connections. Frequently, I/O connections on the north or south side of a package are typically routed from dies on the package to a bottom edge, which are then fanned out, for example, to ball grid arrays or to some other fan-out structure.

In legacy implementations, off-package bandwidth from a system-on-a-chip (SOC) or field programmable gate array (FPGA) fans out from the pins at the bottom of the package. These legacy implementations limit the amount of bandwidth that may be provisioned from the package on a given edge of the package. For example, legacy implementations have tried to overlap multiple electrical interfaces on a given package edge, but only one of the interfaces bonds out of the package.

In embodiments described herein, off-package bandwidth for a particular edge of a package uses both an optical fan-out and an electrical fan-out on the same edge of the package. In embodiments, the optical fan-out may use a top surface or side edge of a die and the electrical SERDES link may use the bottom side edge of the die to fan-out.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an ASIC, an electronic circuit, a processor (shared, dedicated, or group) and/or memory (shared, dedicated, or group) that execute one or more software or firmware programs, a combinational logic circuit, and/or other suitable components that provide the described functionality.

Various Figures herein may depict one or more layers of one or more package assemblies. The layers depicted herein are depicted as examples of relative positions of the layers of the different package assemblies. The layers are depicted for the purposes of explanation, and are not drawn to scale. Therefore, comparative sizes of layers should not be assumed from the Figures, and sizes, thicknesses, or dimensions may be assumed for some embodiments only where specifically indicated or discussed.

FIG. 1 illustrates a perspective view of a package assembly that includes an edge with electrical interfaces, in accordance with embodiments. Package 100 includes a substrate 102, with the first die 104 electrically and physically coupled to the substrate 102, and a second die 108 electrically and physically coupled with substrate 102. The first die 104 and the second die 108 are electrically coupled. In embodiments, the second die 108 may have multiple functions or tiles (not shown), embodiments of which may be described in more detail with respect to FIG. 2.

The first die 104 and the second die 108 may be coupled with an embedded multi-die Interconnect Bridge (EMIB) 110. In other embodiments, the first die 104 and the second die 104 may be coupled using a silicon interconnect (not shown), or coupled using some other interconnect structure. In embodiments, the first die 104 may include or be an optical tile. Package 100 includes two dies 104, 108, however, in other embodiments, the package may include additional dies, as well as additional features that may be found with respect to various SOC configurations.

Package 100 includes an edge 100a that may include a fan-out 124. In embodiments, the fan-out 124 may be electrically coupled with various tiles (not shown) within the die 108 via one or more traces 122. In embodiments, the traces 122 may travel vertically through the substrate 102, for example through a via 122a through one or more layers of the substrate 102, or along a surface 122b of a layer of the substrate 102 as an electrical trace.

Turning now to the edge 100a, the fan-out 124 is shown at the bottom of the edge 100a of package 100. In legacy implementations, the I/O interconnects implemented by the fan-out 124 would be the only I/O interfaces that would exist on the package edge 100a. Thus, the portion of the edge 100a along height X 129 in legacy implementations is unused for any additional I/O interfaces. In addition, with respect to the first die 104, any height 104a of the die 104 that is above the top of the substrate 102 may also be considered part of the height X 129 of the edge 100a and may include additional I/O interfaces, in particular optical interfaces which may couple with optical fibers as discussed in more detail with respect to FIG. 2.

Figure 2:
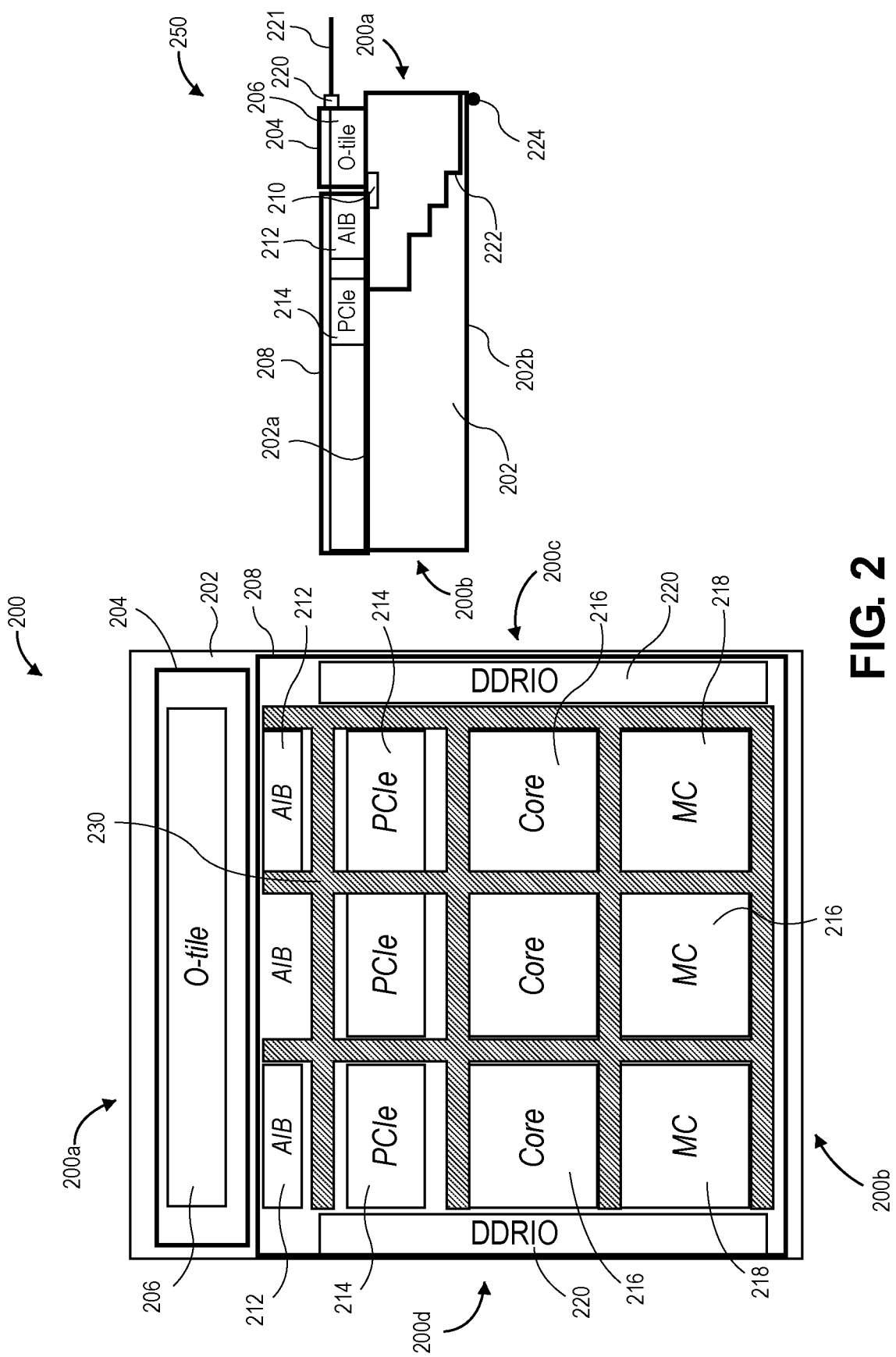
FIG. 2 illustrates a top-down view and a side view of an example package assembly that has electrical and optical interfaces at different heights along an edge of the package, in accordance with embodiments.

In embodiments, additional I/O interfaces, optical or electrical, may be placed in other locations on edge 100a. In embodiments (not shown), these I/O interfaces may be aligned with one or more layers associated with the substrate 102, and may be electrically or optically coupled with dies 104, 108, or with any other feature within the package 100. For example, regions that may be used for additional I/O interfaces may include, but are not limited to, regions 160, 162, 164, 168. In embodiments, with respect to regions 160, 162, 164, any I/O interfaces may require portions of the substrate 102 to be removed, or traces and vias added to allow electrical connections to interfaces placed in these respective regions. FIG. 2 below goes into greater detail with respect to one of these embodiments, in particular optical connections at the top of edge 100a where the die 104 is an optical connector.

FIG. 2 illustrates a top-down view and a side view of an example package assembly that has electrical and optical interfaces at different heights along an edge of the package, in accordance with embodiments. Package 200 shows a top-down view with four edges: a north edge 200a, a south edge 200b, an east edge 200c, and a west edge 200d. In embodiments, package 200 may be similar to package 100 of FIG. 1. Package 200 includes a substrate 202, which may be similar substrate 102 of FIG. 1, onto which a first die 204, which may be similar to first die 104 of FIG. 1, is coupled to the substrate 202 at the north edge 200a of the package. In embodiments, the north edge 200a of the package may be similar to the edge of the package 102 of FIG. 1 on which regions 160, 162, 164 are shown. The first die 204 includes an optical tile 206. In embodiments, the first die 204 may include multiple optical tiles (not shown). A second die 208 is coupled to the substrate 202, and is also electrically coupled with the first die 204.

The second die 208 includes a number of tiles including advanced interface bus 212, peripheral component interconnect express (PCIe) 214, core memory 216 and memory controllers (MC) 218. For package 200, the east edge 200c and the west edge 200d are typically used for wide memory/low latency interfaces 220 which may take up most if not all of these edges. Thus, this limits the additional fan-out possibilities available for the east edge 200c and the west edge 200d for other I/O. These wide memory/low latency interfaces 220 may include, for example, double data rate (DDR)/dynamic random access memory (DRAM) access. As a result, the north edge 200a and the south edge 200b of the package are available for SERDES lanes. Improving the aggregate off-package bandwidth using the north edge 200a or the south edge 200b allows for increased I/O and memory access bandwidth.

Diagram 250 shows package 200 from a side view, where the north edge 200a is shown to the right and the south edge 200b is shown to the left. The second die 208 may be electrically coupled with the first die 204 through an EMIB 210, which may be similar to EMIB 110 of FIG. 1. In other embodiments a passive silicon interposer, an active silicon interposer, redistribution layer (RDL) packaging, or patch on interposer may be used to perform the electrical coupling between the first die 204 and the second die 208. In the embodiment as shown, the EMIB 210 electrically couples the AIB 212 tile with the optical tile 206.

In embodiments, one or more optical couplers 220 may couple with the optical tile 206 in the first die 204 to provide an optical fan-out on the north edge 200a of the package 200. In embodiments, the data transmitted and received via the optical fibers 221 coupled with the optical couplers 220 may be data from the various tiles 214, 216, 218 within the second die 208. In embodiments, one or more electrical coupling 222 may be coupled with tiles in the second die 208, for example the PCIe 214 tiles, to an electrical fan-out 224. In embodiments, the electrical coupling 222, which may also be referred to as traces, may travel from the second die 208 through or along layers in the substrate 202 and reach the electrical fan-out 224. In embodiments, the layers in the substrate may include shielding (not shown) or other design features to reduce speed degradation or electrical loss in the one or more electrical connectors during operation.

Note: the north edge 200a of package 200 includes an optical coupler 220 and fan-out 224 that are at different heights above a bottom side 202b of the substrate 202. In embodiments, this may be referred to as the optical coupler 220 and fan-out 224 being at different Z-heights.

In embodiments, data from the tiles 212, 214, 216 may be routed using an on-chip network 230. This on-chip network 230 routes the necessary bandwidth generated to the optical and/or electrical SERDES links, including optical couplers 220 and fan-outs 224. For the package 200, for example, if the PCIe tiles 214 are all x16 Gen5 lanes, the aggregate bandwidth will be 384 GB/s. If the optical tile 206 bandwidth via the AIB 212 is 512 GB/s, there may be effectively a 768 GB/s of SERDES bandwidth from the north edge 200a of the package 200. In embodiments, because the AIB 212 may be accessed by any logic via the on-chip network 230, the latency of the on-chip network 230 will reduce a subset of AIB 212 usages that may require closely coupled interactions between the logic on the second die 208 and the optical coupler 220. This may require additional digital logic to wrap around the optical tile 206 or the AIB 212.

Figure 3:
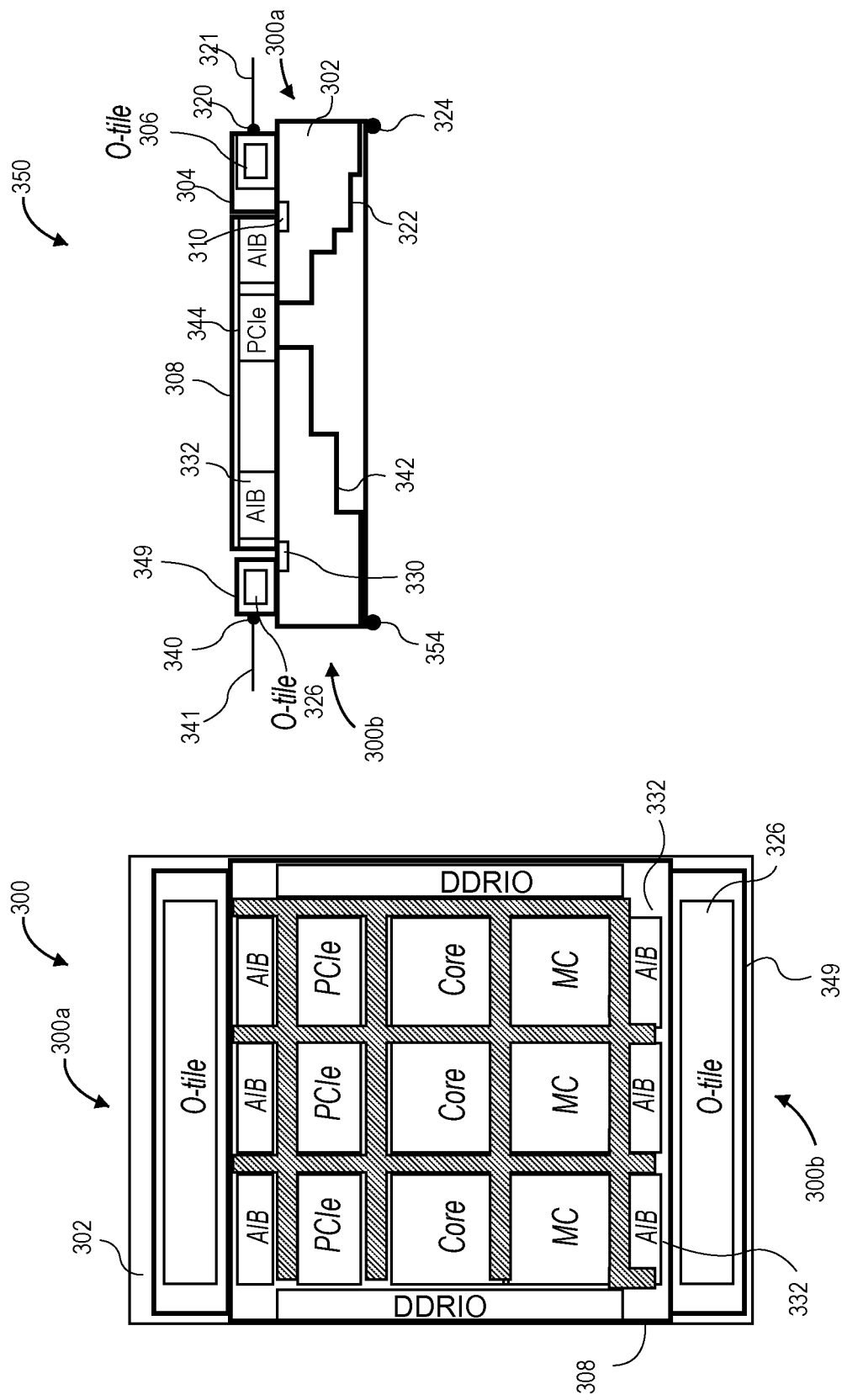
FIG. 3 illustrates a top-down view and a side view of an example package assembly that has electrical and optical interfaces at different heights along two edges of the package, in accordance with embodiments.

FIG. 3 illustrates a top-down view and a side view of an example package assembly that has electrical and optical interfaces at different heights along two edges of the package, in accordance with embodiments. Package 300 may be similar to package 200 of FIG. 2, with a north edge 300a similar to north edge 200a, and a south edge 300b opposite the north edge 300a. However, package 300 has a third die 349 coupled with the substrate 302 and electrically coupled with the second die 308. The third die 349 includes an optical tile 326 that is electrically coupled with AIB tiles 332. This third die 349 may have multiple layers of I/O interfaces as well.

Diagram 350, which may be similar to diagram 250 of FIG. 2. At the north edge 300a, which may be similar to north edge 200a of FIG. 2, includes a substrate 302, which may be similar to substrate 202 of FIG. 2, with a first die 304 that includes an optical tile 306, which may be similar to first die 204 that includes optical tile 206 of FIG. 2. The first die 304 may include an optical coupler 320, which may be coupled with optical fibers 321, which may be similar to optical coupler 220 and optical fibers 221 of FIG. 2. The optical tile 306 may be electrically coupled with the second die 308, which may be similar to second die 208 of FIG. 2, using an EMIB 310, which may be similar to EMIB 210 of FIG. 2.

Diagram 350 shows the south edge 300b that includes the third die 349 that includes an optical tile 326 that is electrically coupled with the AIB 332 using EMIB 330. An optical coupler 340, coupled with the optical tile 326, allows the attachment by one or more fibers 341 to create an optical fan-out. Additional electrical coupling 342, which may be similar to electrical coupling 222 of FIG. 2, and similar to electrical coupling 322, may couple a PCIe tile 344 with the electrical fan-out 354. In this way, both the north edge 300a and the south edge 300b of the package 300 may serve as high density bandwidth connections with optical and electrical interfaces. With these and other embodiments described herein, this allows package 300 two maximize I/O bandwidth on one or more edges of the package.

Figure 4:
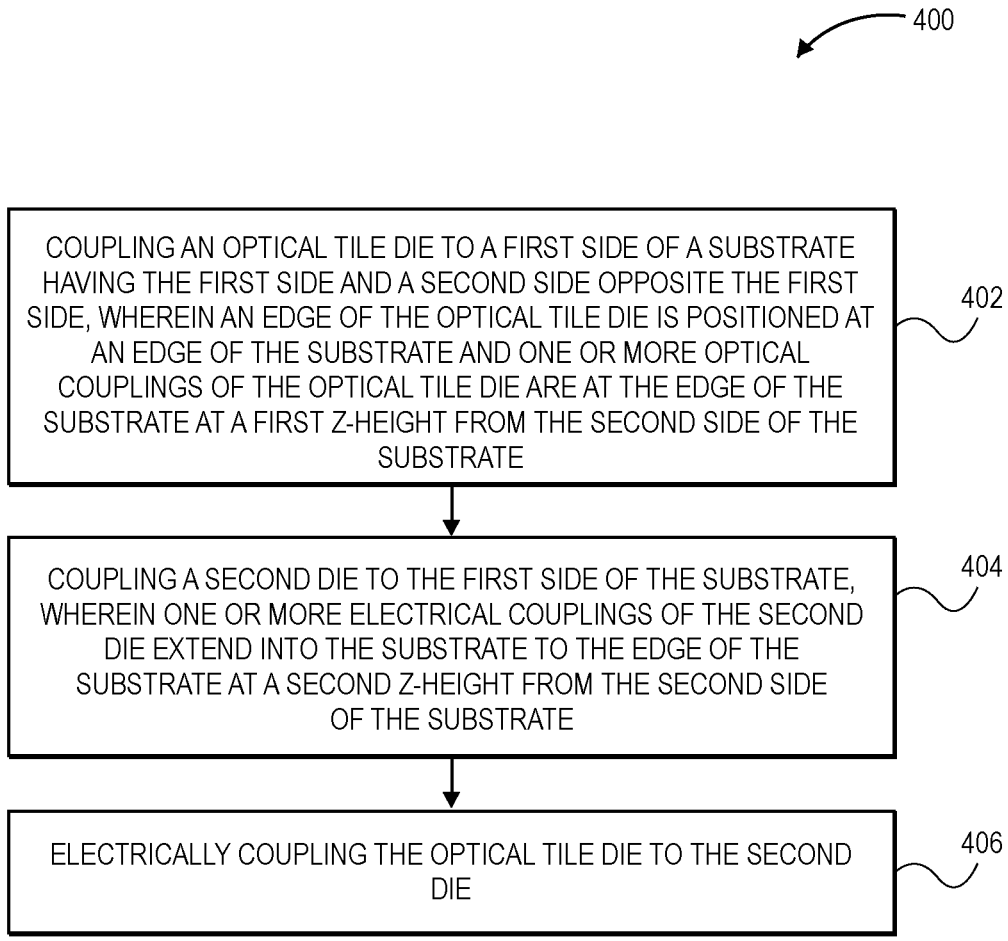
FIG. 4 illustrates an example of a process to assemble a package that has electrical and optical interfaces at different heights along an edge of a package, in accordance with embodiments.

FIG. 4 illustrates an example of a process to assemble a package that has electrical and optical interfaces at different heights along an edge of a package, in accordance with embodiments. Process 400 may be performed by devices, processes, or techniques described herein, and in particular related to FIG. 1-3.

At block 402, the process may include coupling an optical tile die to a first side of a substrate having the first side and a second side opposite the first side, wherein an edge of the optical die is positioned at an edge of the substrate and one or more optical couplings of the optical tile die are at the edge of the substrate at a first Z-height from the second side of the substrate. The optical tile die may include the first die 204 and/or the optical tile 206 on the first die 204. The substrate may be substrate 202, that has a top side 202a and a bottom side 202b opposite the top side. The edge of the optical tile die and the edge of the substrate may correspond to north edge 200a of FIG. 2, or may correspond to north edge 300a or south edge 300b of FIG. 3. The optical couplings of the optical tile die may include optical coupler 220 of FIG. 2, or optical couplings 320 and/or 340 of FIG. 3. The first Z-height may correspond to the Z-height difference between the second side 202b of the substrate 202 and the height of the optical coupler 220 of FIG. 2.

At block 404, the process may include coupling a second die to the first side of the substrate, wherein one or more electrical couplings of the second die extend into the substrate to the edge of the substrate at a second Z-height from the second side of the substrate. The second die may correspond to the second die 208 of FIG. 2. Electrical couplings of the second die 208 may include electrical couplings 222 within the substrate 202 that lead to electrical fan-out 224 of FIG. 2. In embodiments, these electrical couplings 222 may follow layers within the substrate 202. In other embodiments, these layers within the substrate 202 may include electrical shielding or other design elements to prevent electrical loss within the electrical couplings 222. The second Z height may correspond to the Z height difference between the second side 202b of the substrate 202 and the height of the fan-out 224 at the north edge 200a of the substrate 202 of FIG. 2.

In embodiments, the second die may correspond to the second die 308 of FIG. 3. Electrical couplings of the second die 308 may include electrical couplings 322, 342 within the substrate 302 that lead to electrical fan-outs 354, 324. In embodiments, these electrical couplings 322, 342 may follow layers within the substrate 302, and may include traces (not shown) on the substrate or vias to electrically couple traces between substrate layers. The layers within the substrate 302 may include electrical shielding or other design elements to prevent electrical loss within the electrical couplings 322, 342.

At block 406, the process may include electrically coupling the optical tile die to the second die. Electrically coupling the optical tile die to the second die may be done using an EMIB 210 to couple the optical tile 206 within the first die 202 with an MB 212 in the second die 208 as shown with respect to FIG. 2. In other embodiments, the electrical coupling may be accomplished using a passive silicon interposer, an active silicon interposer, RDL packaging, or patch on interposer.

In embodiments, electrically coupling the optical tile die may further include electrically coupling the optical tile dies 306, 326 to the second die using, respectively, two EMIB 310, 330 structures. In embodiments, there may be two AIB 312, 332 in the second die 308.

Figure 5:
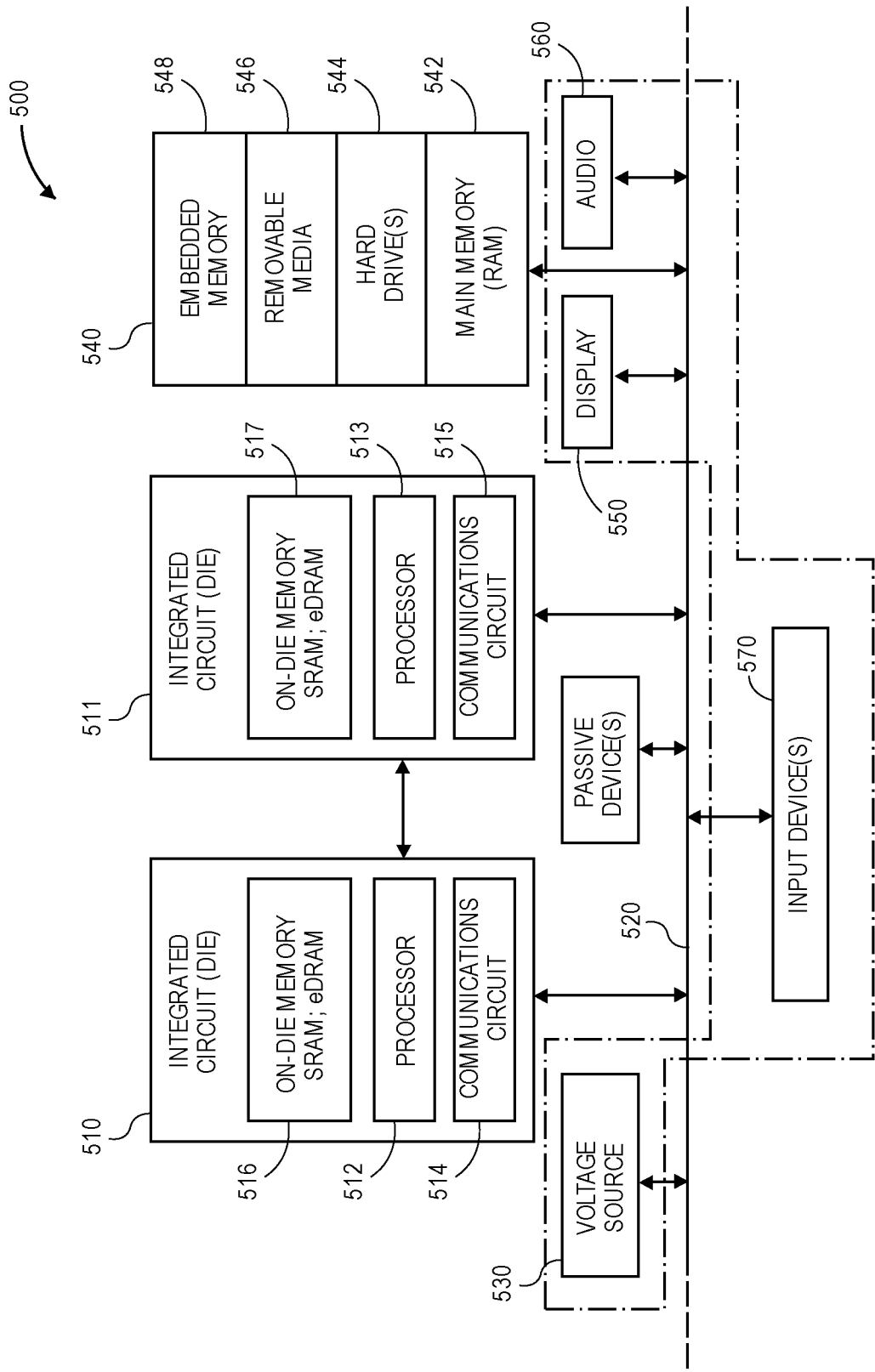
FIG. 5 schematically illustrates a computing device, in accordance with embodiments.

FIG. 5 schematically illustrates a computing device, in accordance with embodiments. The computer system 500 (also referred to as the electronic system 500) as depicted can embody electrical and optical interfaces at different heights along an edge of a package, according to any of the several disclosed embodiments and their equivalents as set forth in this disclosure. The computer system 500 may be a mobile device such as a netbook computer. The computer system 500 may be a mobile device such as a wireless smart phone. The computer system 500 may be a desktop computer. The computer system 500 may be a hand-held reader. The computer system 500 may be a server system. The computer system 500 may be a supercomputer or high-performance computing system.

In an embodiment, the electronic system 500 is a computer system that includes a system bus 520 to electrically couple the various components of the electronic system 500. The system bus 520 is a single bus or any combination of busses according to various embodiments. The electronic system 500 includes a voltage source 530 that provides power to the integrated circuit 510. In some embodiments, the voltage source 530 supplies current to the integrated circuit 510 through the system bus 520.

The integrated circuit 510 is electrically coupled to the system bus 520 and includes any circuit, or combination of circuits according to an embodiment. In an embodiment, the integrated circuit 510 includes a processor 512 that can be of any type. As used herein, the processor 512 may mean any type of circuit such as, but not limited to, a microprocessor, a microcontroller, a graphics processor, a digital signal processor, or another processor. In an embodiment, the processor 512 includes, or is coupled with, electrical and optical interfaces at different heights along an edge of a package, as disclosed herein. In an embodiment, SRAM embodiments are found in memory caches of the processor. Other types of circuits that can be included in the integrated circuit 510 are a custom circuit or an application-specific integrated circuit (ASIC), such as a communications circuit 514 for use in wireless devices such as cellular telephones, smart phones, pagers, portable computers, two-way radios, and similar electronic systems, or a communications circuit for servers. In an embodiment, the integrated circuit 510 includes on-die memory 516 such as static random-access memory (SRAM). In an embodiment, the integrated circuit 510 includes embedded on-die memory 516 such as embedded dynamic random-access memory (eDRAM).

In an embodiment, the integrated circuit 510 is complemented with a subsequent integrated circuit 511. Useful embodiments include a dual processor 513 and a dual communications circuit 515 and dual on-die memory 517 such as SRAM. In an embodiment, the dual integrated circuit 510 includes embedded on-die memory 517 such as eDRAM.

In an embodiment, the electronic system 500 also includes an external memory 540 that in turn may include one or more memory elements suitable to the particular application, such as a main memory 542 in the form of RAM, one or more hard drives 544, and/or one or more drives that handle removable media 546, such as diskettes, compact disks (CDs), digital variable disks (DVDs), flash memory drives, and other removable media known in the art. The external memory 540 may also be embedded memory 548 such as the first die in a die stack, according to an embodiment.

In an embodiment, the electronic system 500 also includes a display device 550, an audio output 560. In an embodiment, the electronic system 500 includes an input device such as a controller 570 that may be a keyboard, mouse, trackball, game controller, microphone, voice-recognition device, or any other input device that inputs information into the electronic system 500. In an embodiment, an input device 570 is a camera. In an embodiment, an input device 570 is a digital sound recorder. In an embodiment, an input device 570 is a camera and a digital sound recorder.

As shown herein, the integrated circuit 510 can be implemented in a number of different embodiments, including a package substrate having electrical and optical interfaces at different heights along an edge of a package, according to any of the several disclosed embodiments and their equivalents, an electronic system, a computer system, one or more methods of fabricating an integrated circuit, and one or more methods of fabricating an electronic assembly that includes a package substrate having electrical and optical interfaces at different heights along an edge of a package, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed package substrates having electrical and optical interfaces at different heights along an edge of a package and their equivalents. A foundation substrate may be included, as represented by the dashed line of FIG. 5. Passive devices may also be included, as is also depicted in FIG. 5.

Examples

The following paragraphs describe examples of various embodiments.

Example 1 is a package comprising: a substrate having a first side and a second side opposite the first side; an optical tile die coupled to the first side of the substrate, wherein an edge of the optical tile die is at an edge of the substrate; a second die coupled to the first side of the substrate and electrically coupled with the optical tile die; wherein one or more optical couplings of the optical tile die are at the edge of the substrate at a first Z-height from the second side of the substrate; and wherein one or more electrical couplings of the second die extend into the substrate to the edge of the substrate at a second Z-height from the second side of the substrate, wherein the first Z-height and the second Z-height are different Z-heights to increase input/output (TO) bandwidth along the edge of the substrate.

Example 2 may include the package of example 1, wherein the second Z-height is zero.

Example 3 may include the package of example 1, wherein the second die is electrically coupled with the optical tile die via an advanced interface bus (AIB).

Example 4 may include the package of example 3, wherein the second die is electrically coupled with the optical tile die via a selected one of: an embedded multi-die Interconnect Bridge (EMIB), a passive silicon interposer, an active silicon interposer, redistribution layer (RDL) packaging, or patch on interposer.

Example 5 may include the package of example 1, further including fiber coupled with the one or more optical couplings of the optical tile die.

Example 6 may include the package of example 1, wherein the substrate includes a plurality of layers, and wherein the one or more electrical couplings are routed on the plurality of layers.

Example 7 may include the package of example 6, wherein at least one of the plurality of layers includes shielding to reduce speed degradation or electrical loss of the one or more electrical couplings.

Example 8 may include the package of example 1, wherein the one or more electrical couplings of the second die at the edge of the substrate are coupled to a fanout structure.

Example 9 may include the package of example 1, wherein the second die includes multiple functions.

Example 10 may include the package of example 1, wherein the second die includes a function coupled with the one or more electrical couplings.

Example 11 may include the package of example 10, wherein the function is a peripheral component interconnect express (PCIe) function.

Example 12 may include the package of any one of examples 1-11, wherein the optical tile die is a first optical tile die and the edge of the substrate is a first edge of the substrate; and further comprising: a second optical tile die coupled to the first side of the substrate, wherein an edge of the second optical tile die is at a second edge of the substrate opposite the first edge of the substrate; wherein the second optical tile die is electrically coupled to the second die; wherein one or more optical couplings of the second optical tile die are at the second edge of the substrate at a third Z-height from the second side of the substrate; and wherein one or more electrical couplings of the second die extend into the substrate to the second edge of the substrate at a fourth Z-height from the second side of the substrate, wherein the third Z-height and the fourth Z-height are different Z-heights to increase I/O bandwidth along the second edge of the substrate.

Example 13 is a method comprising: coupling an optical tile die to a first side of a substrate having the first side and a second side opposite the first side, wherein an edge of the optical die is positioned at an edge of the substrate and one or more optical couplings of the optical tile die are at the edge of the substrate at a first Z-height from the second side of the substrate; coupling a second die to the first side of the substrate, wherein one or more electrical couplings of the second die extend into the substrate to the edge of the substrate at a second Z-height from the second side of the substrate; and electrically coupling the optical tile die to the second die.

Example 14 may include the method of example 13, wherein the second Z-height is zero.

Example 15 may include the method of example 13, wherein the second die is electrically coupled with the optical tile die via an advanced interface bus (MB).

Example 16 may include the method of example 13, wherein the substrate includes a plurality of layers and wherein the one or more electrical couplings are routed on or through the plurality of layers.

Example 17 may include the method of any one of examples 13-16, wherein at least one of the plurality of layers includes shielding to reduce speed degradation or electrical loss of the one or more electrical couplings.

Example 18 is a system comprising: a motherboard; a package electrically and physically coupled to the motherboard, the package comprising: a substrate having a first side and a second side opposite the first side; an optical tile die coupled to the first side of the substrate, wherein an edge of the optical tile die is at an edge of the substrate; a second die coupled to the first side of the substrate and electrically coupled with the optical tile die; wherein one or more optical couplings of the optical tile die are at the edge of the substrate at a first Z-height from the second side of the substrate; and wherein one or more electrical couplings of the second die extend into the substrate to the edge of the substrate at a second Z-height from the second side of the substrate, wherein the first Z-height and the second Z-height are different Z-heights to increase input/output (TO) bandwidth along the edge of the substrate.

Example 19 may include the system of example 18, wherein the packages coupled to a fanout structure on the motherboard.

Example 20 may include the system of any one of examples 18-19, further comprising another component coupled with the motherboard, the other component optically coupled with the optical tile die.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or to limit embodiments to the precise forms disclosed. While specific embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit the embodiments to the specific implementations disclosed in the specification and the claims. Rather, the scope of the invention is to be determined entirely by the following claims, which are to be construed in accordance with established doctrines of claim interpretation.

What is claimed is:

1. A package comprising:
    a substrate having a first side and a second side opposite the first side;
    a first optical file die on the first side of the substrate, wherein an edge of the first optical tile die is at a first edge of the substrate;
    a second die on the first side of the substrate and electrically coupled with the first optical tile die, wherein a first set of one or more optical couplings of the first optical tile die are at the first edge of the substrate at a first Z-height representing a distance from the second side of the substrate, and wherein one or more electrical couplings of the second die extend into the substrate to the first edge of the substrate at a second Z-height representing a distance from the second side of the substrate; and
    a second optical tile die on the first side of the substrate, wherein an edge of the second optical tile die is at a second edge of the substrate, wherein the second optical tile die is electrically coupled to the second die, wherein a second set of one or more optical couplings of the second optical tile die are at the second edge of the substrate at a third Z-height representing a distance from the second side of the substrate.

2. The package of claim 1, wherein the second Z-height is zero.

3. The package of claim 1, wherein the second die is electrically coupled with the first optical tile die or the second optical tile die via an advanced interface bus (AIB).

4. The package of claim 3, wherein the second die is electrically coupled with the first optical tile die or the second optical tile die via a selected one of: an embedded multi-die Interconnect Bridge (EMIB), a passive silicon interposer, an active silicon interposer, redistribution layer (RDL) packaging, or patch on interposer.

5. The package of claim 1, further including fiber coupled with the first set of one or more optical couplings first or with the second set of one or more optical couplings.

6. The package of claim 1, wherein the substrate includes a plurality of layers, and wherein the one or more electrical couplings are routed on the plurality of layers.

7. The package of claim 6, wherein at least one of the plurality of layers includes shielding to reduce speed degradation or electrical loss of the one or more electrical couplings.

8. The package of claim 1, wherein the one or more electrical couplings of the second die at the edge of the substrate are coupled to a fanout structure.

9. The package of claim 1, wherein the second die includes multiple functions.

10. The package of claim 1, wherein the second die includes a function coupled with the one or more electrical couplings.

11. The package of claim 10, wherein the function is a peripheral component interconnect express (PCIe) function.

12. The package of claim 1,
wherein the one or more electrical couplings is a first set of one or more electrical couplings; and further comprising a second set of one or more electrical couplings coupled with the second die that extend into the substrate to the second edge of the substrate at a fourth Z-height representinv a distance from the second side of the substrate, wherein the third Z-height and the fourth Z-height are different Z-heights.

13. A method comprising:
coupling a first optical tile die to a first side of a substrate, wherein the substrate has the first side and a second side opposite the first side, wherein an edge of the optical die is positioned at a first edge of the substrate, and wherein one or more optical couplings of the optical tile die are at the first edge of the substrate at a first Z-height representing a distance from the second side of the substrate;
coupling a second die to the first side of the substrate, wherein one or more electrical couplings of the second die extend into the substrate to the first edge of the substrate at a second Z-height from the second side of the substrate;
coupling a second optical die to the first side of the substrate, wherein an edge of the second optical the die is at a second edge of the substrate, wherein the second optical the die is electrically coupled to the second die, wherein a second set of one or more optical couplings of the second optical tile die are at the second edge of the substrate at a third Z-height representing a distance from the second side of the substrate, and wherein one or more electrical couplings of the second die extend into the substrate to the second edge of the substrate at a fourth Z-height representing a distance from the second side of the substrate; and
electrically coupling the the first optical tile die and the second optical die to the second die.

14. The method of claim 13, wherein the second Z-height is zero.

15. The method of claim 13, wherein the second die is electrically coupled with the optical tile die via an advanced interface bus (AIB).

16. The method of claim 13, wherein the substrate includes a plurality of layers and wherein the one or more electrical couplings are routed on or through the plurality of layers.

17. The method of claim 16, wherein at least one of the plurality of layers includes shielding to reduce speed degradation or electrical loss of the one or more electrical couplings.

18. A system comprising:
a motherboard; and
a package electrically and physically coupled to the motherboard, the package comprising:
a substrate having a first side and a second side opposite the first side;
a first optical tile die coupled to the first side of the substrate, wherein an edge of the first optical tile die is at a first edge of the substrate;
a second die coupled to the first side of the substrate and electrically coupled with the first optical tile die, wherein a first set of one or more optical couplings of the first optical tile die are at the first edge of the substrate at a first Z-height representing a distance from the second side of the substrate,
and wherein a first set of one or more electrical couplings of the second die extend into the substrate to the first edge of the substrate at a second Z-height from the second side of the substrate;
a second optical tile die coupled to the first side of the substrate, wherein the second optical tile die is electrically coupled to the second die, wherein a second set of one or more optical couplings of the second optical tile die are at a second edge of the substrate at a third Z-height representing a distance from the second side of the substrate; and
wherein a second set of one or more electrical couplings of the second die extend into the substrate to the second edge of the substrate at a fourth Z-height representing a distance from the second side of the substrate.

19. The system of claim 18, wherein the package is coupled to a fanout structure on the motherboard.

20. The system of claim 18, further comprising another component coupled with the motherboard, the other component optically coupled with the first optical tile die or the second optical file die.

* * * * *